US006624693B2

(12) United States Patent
Yamashita

(10) Patent No.: US 6,624,693 B2
(45) Date of Patent: Sep. 23, 2003

(54) AMPLIFICATION CIRCUIT FOR ELECTRIC CHARGE TYPE SENSOR

(75) Inventor: Muneharu Yamashita, Nei-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/103,228

(22) Filed: Mar. 19, 2002

(65) Prior Publication Data

US 2002/0125943 A1 Sep. 12, 2002

Related U.S. Application Data

(62) Division of application No. 09/858,806, filed on May 16, 2001, now Pat. No. 6,392,477.

(30) Foreign Application Priority Data

May 17, 2000 (JP) ........................................ 2000-145462

(51) Int. Cl.[7] ................................................. H03F 3/45
(52) U.S. Cl. ........................ 330/69; 330/109; 330/174
(58) Field of Search ........................ 330/69, 109, 174, 330/271, 281; 327/359, 363

(56) References Cited

U.S. PATENT DOCUMENTS

| | | | | | |
|---|---|---|---|---|---|
| 3,746,968 A | * | 7/1973 | Pease | .......................... | 321/60 |
| 3,747,007 A | * | 7/1973 | Geitner | ........................ | 330/51 |
| 5,982,232 A | * | 11/1999 | Rogers | ........................ | 330/69 |

* cited by examiner

Primary Examiner—Henry Choe
(74) Attorney, Agent, or Firm—Keating & Bennett, LLP

(57) ABSTRACT

An amplification circuit for electric charge type sensor has a simple circuit configuration in which a common mode noise is adequately cancelled. In the acceleration sensor amplification circuit, the inversion input terminal of an operational amplifier is connected to one end of the acceleration sensor (G sensor). In addition, a feedback circuit including a feedback resistor and a feedback capacitor connected in parallel to each other is connected between the inversion input terminal and the output terminal of the operational amplifier. Furthermore, a cancellation circuit including a cancel resistor and a cancel capacitor connected in parallel to each other is connected between the non-inversion input terminal of the operational amplifier and a reference voltage.

3 Claims, 4 Drawing Sheets

AMPLIFICATION CIRCUIT FOR ELECTRIC CHARGE TYPE SENSOR

This is a divisional of U.S. patent application Ser. No. 09/858,806, filed May 16, 2001 in the name of Muneharu YAMASHITA and entitled AMPLIFICATION CIRCUIT FOR ELECTRIC CHARGE TYPE SENSOR, now U.S. Pat. No. 6,392,477.

BACKGROUND OF THE INVENTION

1. Field of the Invention

The present invention relates to amplification circuit for electric charge type sensor used for amplifying and outputting the outputs of the electric charge type sensors such as acceleration sensors.

2. Description of the Related Art

There are conventionally known sensor apparatuses incorporating sensors in which detection signals are outputted in the form of electric charge, such as a piezoelectric type acceleration sensor apparatus and a pyroelectric type infrared-ray sensor apparatus. In such a sensor apparatus, a very small amount of electric charge is generated when the sensor detects an acceleration, an infrared ray, etc. In this case, for example, the amount of generated electric change is from 0.01 pC to a few thousands pC. Accordingly, an amplification circuit is used for amplifying the output of the sensor to extract as a voltage signal. In addition, the piezoelectric type acceleration sensor apparatus is utilized to detect vehicles' air-bag operation (collision detection), angular acceleration generated when a vehicle spins, an impact on a hard disk drive, and the like.

A conventional amplification circuit which amplifies the output of a sensor with a charge amplifier is disclosed in the Japanese Unexamined Patent Application Publication No. 8-338781. FIG. 5 shows the structure of the conventional amplification circuit. The amplification circuit includes a resistor (a feedback resistor) R11 connected between the inversion input terminal of an operational amplifier Amp and the output terminal thereof. The resistor R11 is connected in parallel to the capacitor (a feedback capacitor) C11. One end of an acceleration sensor (G sensor) is connected to the inversion input terminal of the operational amplifier Amp, and the other end of the sensor is connected to a reference voltage Vref. The non-inversion input terminal of the operational amplifier is connected to the reference voltage Vref.

In the above amplification circuit, when vibrations are applied to the acceleration sensor, the acceleration sensor amplifies and outputs an electric charge Q corresponding to the magnitudes of generated acceleration and the vibrations. When the charge sensitivity of the acceleration sensor is expressed by d[pC/G], an output voltage Vout(G) with respect to an acceleration G will be obtained by the following equation. The symbol s is Laplace operator.

$$Vout(G) = -d \times G \times \left( \frac{1}{C11 \times \left(1 + \frac{1}{s \times C11 \times R11}\right)} \right) \quad \text{[EQUATION 7]}$$

In the conventional amplification circuit, however, as will be described below, it is impossible to obtain an output Vout (the output of the operational amplifier Amp) in which a common mode noise overlapping with the output of the acceleration sensor is adequately cancelled. FIG. 6 shows a common mode noise mixture model in the conventional amplification circuit. In FIG. 6, the reference numerals Vn11, Cn11, Vn12, and Cn12 denote noise sources. Since the noise voltage Vn12 is connected to the reference voltage Vref via the capacitor Cn12, the noise voltage Vn12 has no influence on the output Vout of the operational amplifier Amp. In contrast, since the noise voltage Vn11 is connected to the inversion input terminal of the operational amplifier Amp via the capacitor Cn11, the noise voltage Vn11 has an influence on the output Vout of the operational amplifier Amp. As a result, the output Vout(N) of the operational amplifier Amp influenced by the common mode noise will be obtained by the following equation.

$$Vout(N) = -\frac{s \times Cn11}{C11} \times \frac{1}{\left(1 + \frac{1}{s \times C11 \times R11}\right)} \times Vn11 \quad \text{[EQUATION 8]}$$

Based on Equations 7 and 8, there will be obtained a signal to noise ratio (S/N ratio) in the output Vout of the operational amplifier Amp as follows:

$$S/N = Vout(G)/Vout(N) \quad \text{[EQUATION 9]}$$
$$= \frac{d}{s \times Cn11} \times \frac{G}{Vn11}$$

On the other hand, as a circuit configuration capable of obtaining an output in which a common mode noise overlapping with the output of an acceleration sensor is properly cancelled, a differential amplification circuit is shown in FIG. 7. However, the circuit configuration is complicated, thereby increasing the production cost.

As one of techniques for obtaining outputs in which common mode noises overlapping with the outputs of acceleration sensors are adequately cancelled, Japanese Unexamined Patent Application Publication No. 5-188081 discloses a circuit configuration. A plurality of strip electrodes are disposed on a surface of a piezoelectric element (an acceleration sensor). The directions of polarization between the adjacent slip electrodes are opposite to each other. A ground electrode is disposed on the other surface of the piezoelectric element. In this case, whereas an amplification circuit amplifying a detection output of the acceleration sensor can have a simple circuit configuration, it is inevitable to use the piezoelectric element having a complicated element structure. As a result, there is a problem in that the production cost increases.

SUMMARY OF THE INVENTION

Accordingly, it is an object of the present invention to provide an amplification circuit for electric charge type sensor having a simple circuit configuration in which a common mode noise can be adequately cancelled.

According to a first aspect of the present invention, there is provided an amplification circuit for electric charge type sensor including an operational amplifier having an inversion input terminal, a non-inversion terminal, and an output terminal, the inversion input terminal being connected to one end of an electric charge type sensor and the non-inversion input terminal being connected to the other end of the sensor, a negative feedback circuit including a feedback resistor connected between the output terminal and the inversion input terminal and a feedback capacitor connected in parallel to the feedback resistor, and a cancellation circuit including a resistor connected between the non-inversion input terminal and a reference voltage and a capacitor connected in parallel to the resistor.

In the above circuit configuration, by using the cancellation circuit connected between the non-inversion input terminal of the operational amplifier and the reference voltage, an output of the operational amplifier is obtained, in which a common mode noise overlapping with the output of the electric charge type sensor is adequately cancelled.

According to a second aspect of the present invention, there is provided an amplification circuit for electric charge type sensor including an operational amplifier having an inversion input terminal and a non-inversion input terminal, the inversion input terminal being connected to one end of an electric charge type sensor and the non-inversion input terminal being connected to the other end of the sensor, a voltage divider having a voltage dividing point for dividing a voltage output from the operational amplifier, a negative feedback circuit including a feedback resistor connected between the inversion input terminal and the voltage dividing point and a feedback capacitor connected in parallel to the feedback resistor, and a cancellation circuit including a resistor connected between the non-inversion input terminal and a reference voltage and a capacitor connected in parallel to the resistor.

In this circuit configuration, there can be obtained the same advantages as those obtained in the structure of the first aspect of the invention. In addition, the voltage divider for dividing a voltage output from the operational amplifier permits an amplification rate as the sensitivity of the operational amplifier to be easily adjusted.

Furthermore, the negative feedback circuit may have the same circuit constant as the cancellation circuit has.

In addition, a line connecting the one end of the electric charge type sensor to the inversion input terminal may be arranged in the vicinity of a line connecting the other end of the sensor to the non-inversion input terminal.

In these circuit configurations, a common mode noise overlapping with an output of the piezoelectric sensor can be effectively cancelled

DESCRIPTION OF THE PREFERRED EMBODIMENTS

Now, a description will be given of the embodiments of an acceleration sensor amplification circuit according to the present invention. Individual electronic components, particularly, resistors and capacitors used in the following explanation may be replaced with those used in the configuration in which a plurality of electronic components are electrically connected to each other to obtain desired electrical characteristics.

Figure 1:
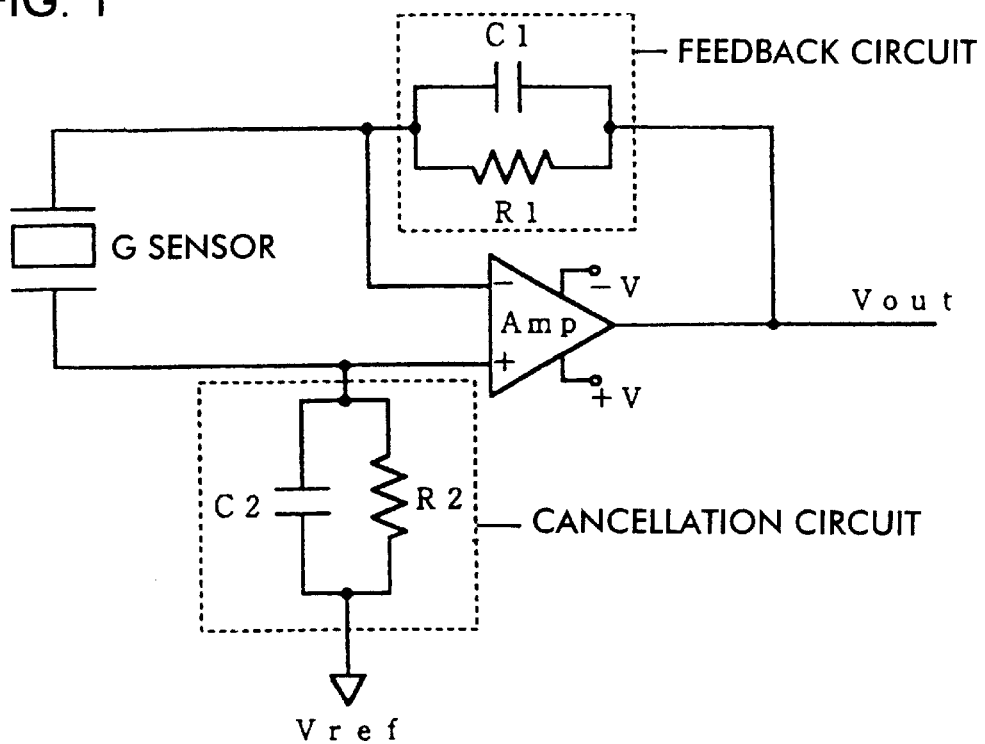
FIG. 1 shows the structure of an acceleration sensor amplification circuit according to an embodiment of the present invention.

FIG. 1 shows a circuit diagram illustrating an acceleration sensor amplification circuit according to an embodiment of the invention. In this acceleration sensor amplification circuit, the inversion input terminal of an operational amplifier Amp is connected to one end of an acceleration sensor (G sensor). Between the inversion input terminal and the output terminal of the operational amplifier Amp is connected a feedback circuit, which is referred to as a negative feedback circuit in the present invention, formed by connecting in parallel a feedback resistor R1 to a feedback capacitor C1. In addition, between the non-inversion input terminal of the operational amplifier Amp and a reference voltage Vref is connected a cancellation circuit in which a cancel resistor R2 is connected in parallel to a cancel capacitor C2. A drive power-source voltage ±V is applied to the operational amplifier Amp.

In the circuit shown in FIG. 1, when an electric charge sensitivity of the acceleration sensor (G sensor) is expressed by d[pC/G], an output voltage Vout 1(G) of the operational amplifier with respect to a detection output of the acceleration sensor (G sensor) will be obtained by the following equation.

$$Vout1(G) = -d \times G \times \left( \frac{1}{C1 \times \left(1 + \frac{1}{s \times C1 \times R1}\right)} + \frac{1}{C2 \times \left(1 + \frac{1}{s \times C2 \times R2}\right)} \right) \quad \text{[EQUATION 1]}$$

Figure 2:
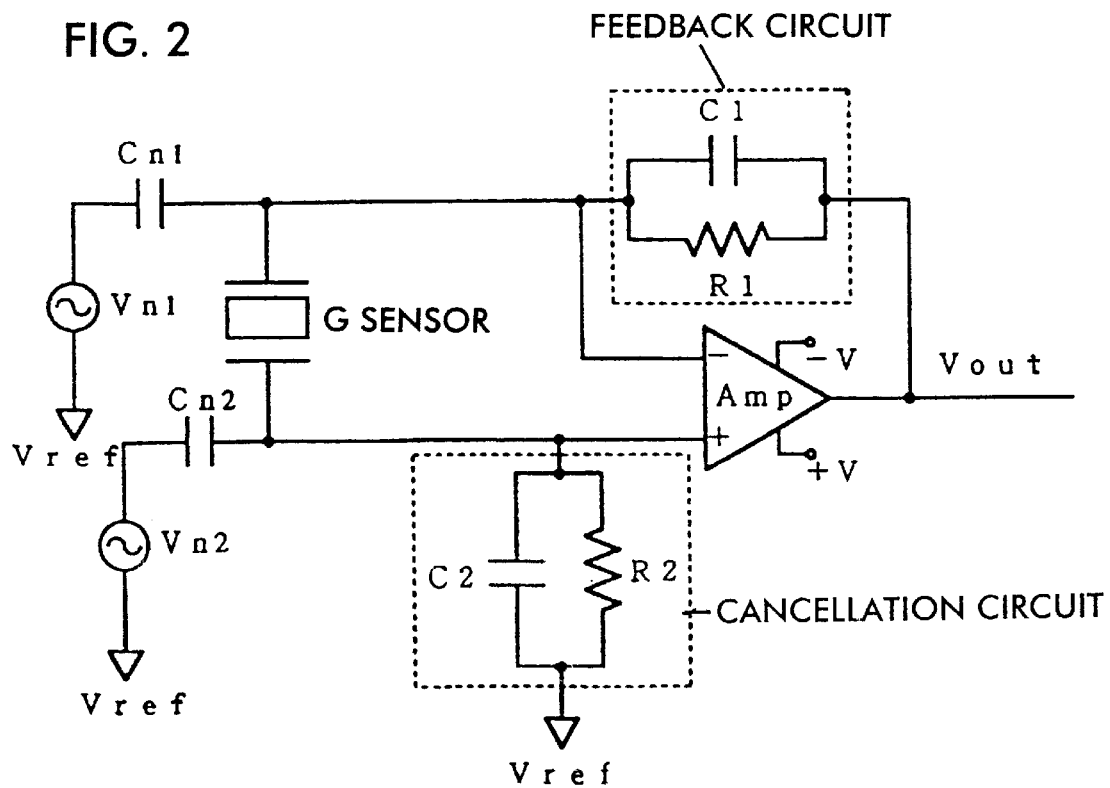
FIG. 2 shows a common mode noise mixture model of the amplification circuit shown in FIG. 1.

Next, a description will be given of the influence of a common mode noise on the above circuit. FIG. 2 shows a common mode noise mixture model of the circuit shown in FIG. 1. In the circuit shown in FIG. 2, the reference numerals Vn1, Cn1, Vn2, and Cn2 denote noise sources. An output voltage Vout 1(N) of the operational amplifier Amp with respect to a noise will be obtained by the following equation.

$$Vout1(N) = \left( \left( \frac{Z2 \times Vn2}{\frac{1}{s \times Cn2} + Z2} \right) \times \left( \frac{\frac{1}{s \times Cn1} + Z1}{\frac{1}{s \times Cn1}} \right) - Z1 \times \frac{Vn1}{\frac{1}{s \times Cn1}} \right) \quad \text{[EQUATION 2]}$$

wherein,
$$Z1 = \frac{R1}{s \times C1 \times R1 + 1}$$
$$Z2 = \frac{R2}{s \times C2 \times R2 + 1}$$

In theory, when the output voltage Vout 1(N) of the operational amplifier Amp with respect to a noise is set to be 0, there can be obtained an output in which a common mode noise is completely cancelled.

The output voltage Vout 1(N) with respect to the noise will be zero when the following conditions are satisfied.

Z1=Z2

Cn1=Cn2

Vn1=Vn2 [EQUATION 3]

The reason for that will be simply explained. As shown in Equation 3, when Z1 is equal to Z2 (=Z) and Cn1 is equal to Cn2 (=Cn), Equation 2 will turn to be as follows:

$$\text{Vout1}(N) = s \times Cn \times Zx \times (Vn2 - Vn1) \quad \text{[EQUATION 4]}$$

As shown in Equation 4, when the equation Vn1=Vn2 as the remaining condition shown in Equation 3 stands, the output voltage of the operational amplifier Amp Vout 1(N) is 0.

Therefore, in the acceleration sensor amplification circuit of the embodiment, by satisfying the conditions shown in Equation 3, there can be obtained the output of the operational amplifier Amp in which the common mode noise is adequately cancelled.

In this case, as shown in Equation 2, the value of Z1 is determined by the feedback resistor R1 and the feedback capacitor C1. The value of Z2 is determined by the cancel resistor R1 and the cancel capacitor C2. By coinciding the circuit constant of the feedback circuit with the circuit constant of the cancellation circuit, the equation Z1=Z2 can be obtained. Specifically, by using the cancel resistor R2 as a resistor having the same resistance value as that of the feedback resistor R1 and using the cancel capacitor C2 as a capacitor having the same capacitance as that of the feedback capacitor C1, the equation Z1=Z2 shown in Equation 3 can be obtained.

Since Vn1, Vn2, Cn1, and Cn2 are noise sources, it is difficult to satisfy the conditions shown in Equation 3: Cn1=Cn2; Vn1=Vn2. However, when a line connected to the inversion input terminal of the operational amplifier is arranged in the vicinity of a line connected to the non-inversion input terminal, Vn1 is approximately equal to Vn2, and Cn1 is approximately equal to Cn2.

Therefore, in the acceleration sensor amplification circuit of the embodiment, there can be obtained an output in which a common mode noise is adequately cancelled by coinciding the circuit constant of the feedback circuit with the circuit constant of the cancellation circuit and by arranging a line connected to the inversion input terminal in the vicinity of a line connected to the non-inversion input terminal.

In this manner, when the cancellation circuit constituted of the cancel resistor R2 and the cancel capacitor C2 connected in parallel to each other is connected between the non-inversion input terminal of the operational amplifier Amp and the reference voltage, an acceleration sensor amplification circuit having an improved S/N ratio is achieved. Furthermore, since the above cancellation circuit is a very simple circuit, the production cost of the circuit does not increase.

Figure 3:
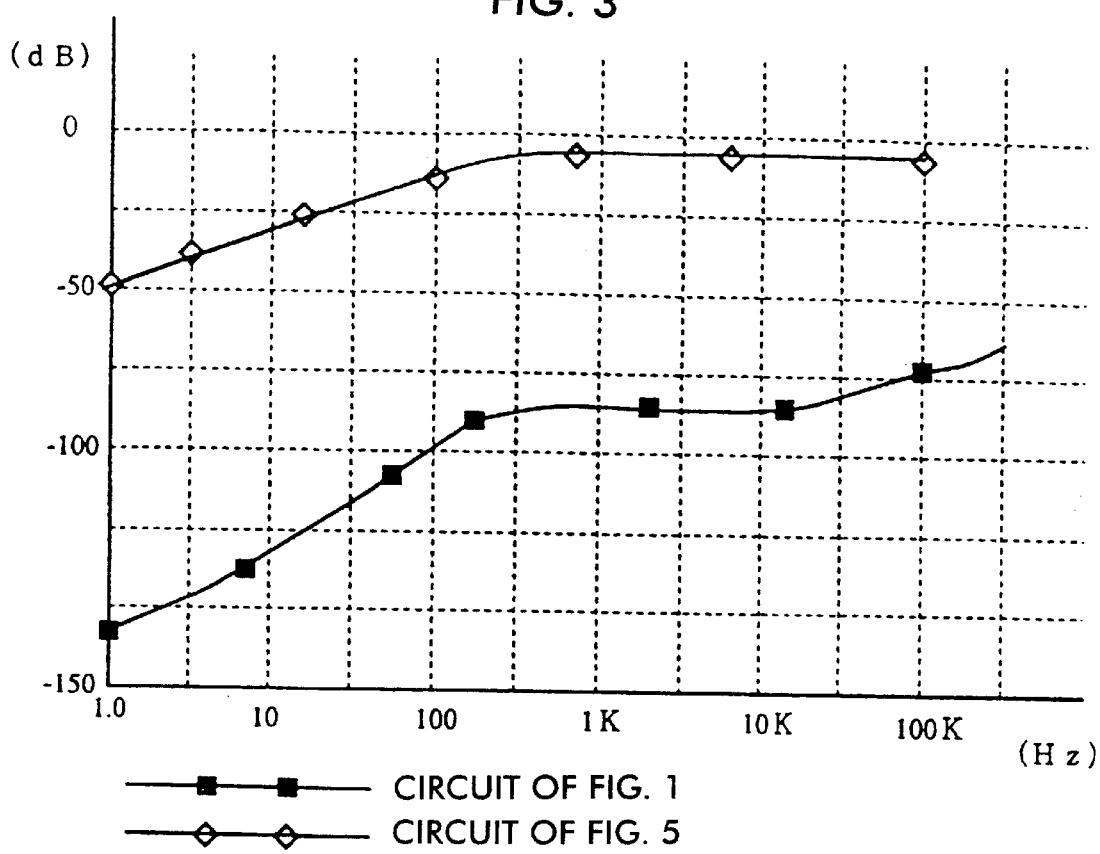
FIG. 3 shows a graph illustrating the characteristics of the acceleration sensor amplification circuit.
Figure 5:
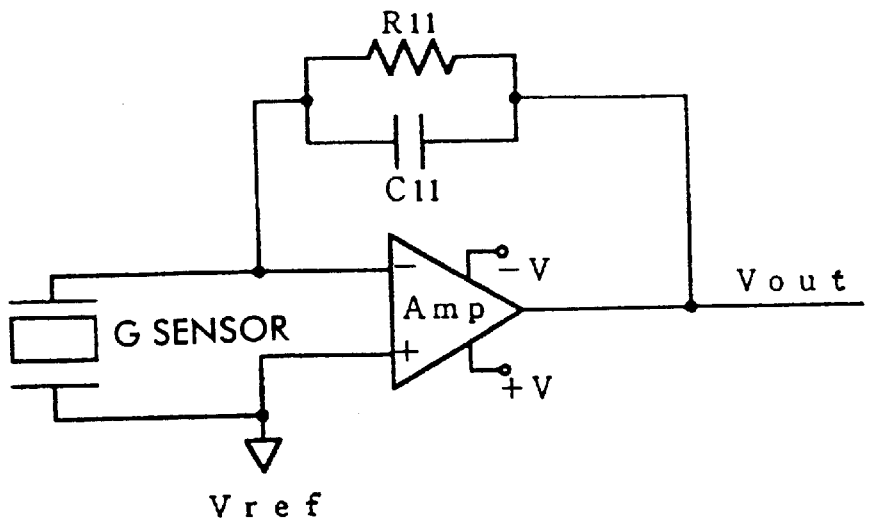
FIG. 5 shows the structure of a conventional acceleration sensor amplification circuit.
Figure 6:
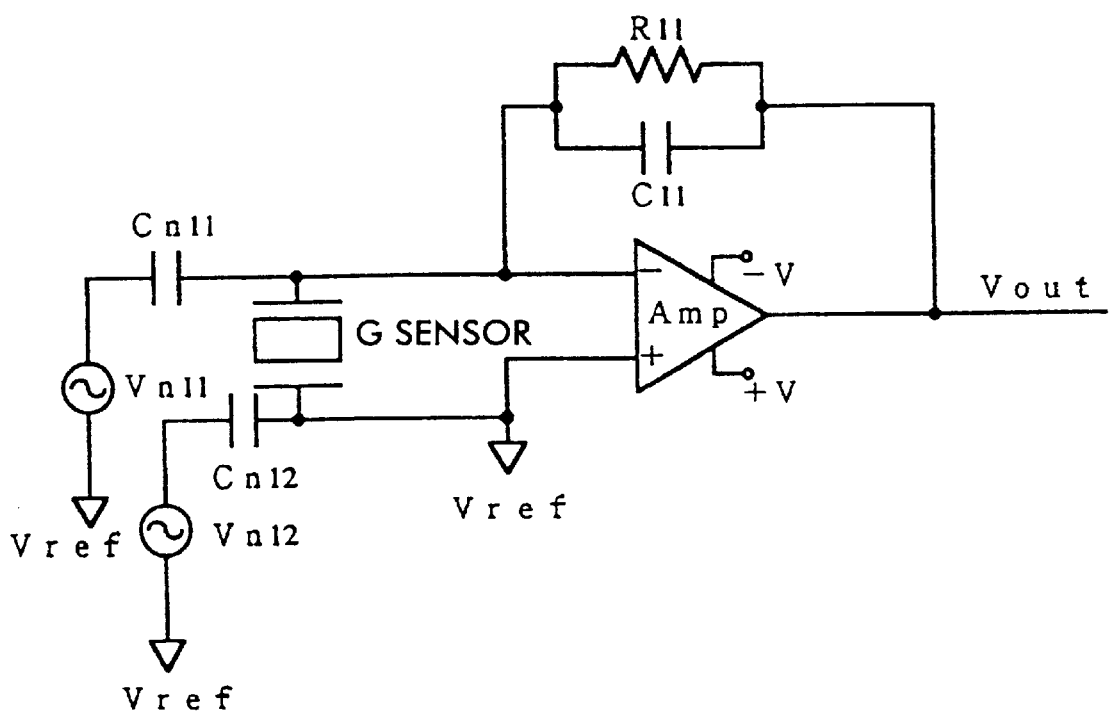
FIG. 6 shows a common mode noise mixture model of the conventional acceleration sensor amplification circuit.
Figure 7:
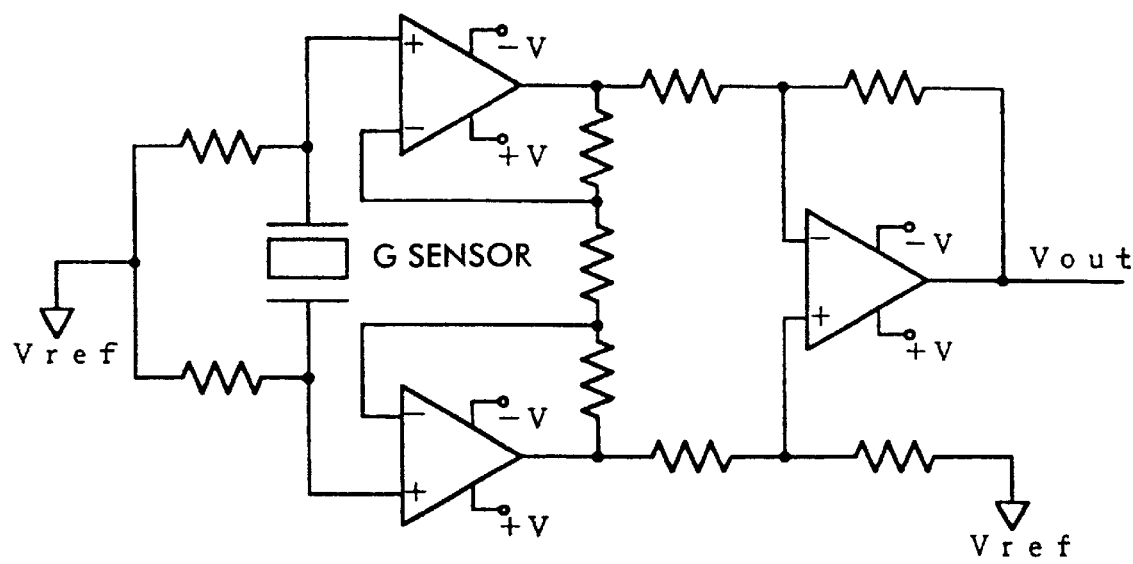
FIG. 7 shows the structure of another conventional acceleration sensor amplification circuit.

FIG. 3 shows a simulation result of an acceleration sensor (G sensor) obtained when the resistance value of each of the feedback resistor R1 and the cancel resistor R2 is set to be 10 MΩ, the capacitance of each of the feedback capacitor C1 and the cancel capacitor C2 is set to be 170 pF, and the charge sensitivity of the acceleration sensor (G sensor) is set to be 0.17 pC/G. The G sensitivity (amplification rate) of the acceleration sensor amplification circuit is 3.4 mV/G. In addition, FIG. 3 also shows the simulation result of the conventional circuit shown in FIG. 5 for comparison. In the simulation result regarding the conventional circuit shown in FIG. 5, the resistance value of the feedback resistor R11 is set to be 10 MΩ, the capacitance of each of the feedback capacitor C11 is set to be 170 pF, and the charge sensitivity of the acceleration sensor (G sensor) is set to be 0.17 pC/G. The G sensitivity (amplification rate) of this circuit is 1.7 mV/G.

In FIG. 3, in order to make a comparison between both circuits under the same conditions, an output noise is divided by the G sensitivity of each circuit to show the result converted into acceleration. In addition, the vertical axis indicates 1 G as 0 dB and the horizontal axis indicates noise frequencies. As found in FIG. 3, in the acceleration sensor amplification circuit according to the present embodiment, the noise is 70 dB lower than a noise generated in the conventional circuit shown in FIG. 5. Thus, obviously, the acceleration sensor amplification circuit has improved S/N ratio significantly.

The simulations were done assuming that the operational amplifiers are ideal types. Thus, actually, there seems to be some changes depending on the performances of the operational amplifiers.

Figure 4:
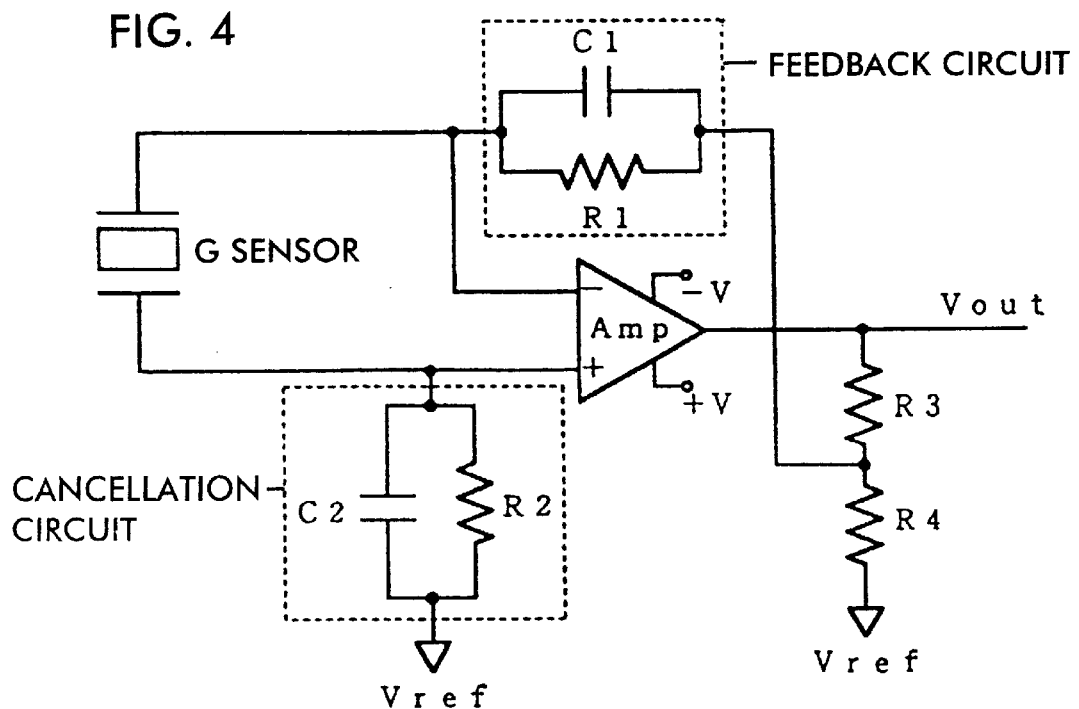
FIG. 4 shows the structure of an acceleration sensor amplification circuit according to another embodiment of the invention.

Next, a description will be given of another embodiment of the present invention. FIG. 4 shows a circuit diagram of the structure of an acceleration sensor amplification circuit according to a second embodiment of the invention. In this acceleration sensor amplification circuit, unlike the acceleration sensor amplification circuit of the first embodiment shown in FIG. 1, voltage dividing resistors R3 and R4 for dividing the output voltage of the operational amplifier Amp are arranged between the output terminal of an operational amplifier Amp and a reference voltage Vref. In addition, the other different point from the circuit shown in FIG. 1 is that one end of the feedback circuit is not connected to the output terminal of the operational amplifier Amp, but connected to a connection point of the voltage dividing resistors R3 and R4, that is, a voltage dividing point.

In the acceleration sensor amplification circuit of the embodiment shown in FIG. 4, when the charge sensitivity of an acceleration sensor (G sensor) is set to be expressed by d[pC/G], an output voltage Vout 2(G) of the operational amplifier Amp with respect to a detection output of the acceleration sensor (G sensor) will be obtained by the following equation.

$$Vout2(G) = Vout1(G) \times \left( \frac{R3 + R4}{R4} + \frac{R3}{Z1 + Z2} \right) \quad \text{[EQUATION 5]}$$

As shown in Equation 5, in the acceleration sensor amplification circuit of the embodiment, a gain {(R3+R4)/R4}+{R3/(Z130 Z2)} is provided to the circuit shown in FIG. 1.

In addition, the output voltage Vout 2(N) of the operational amplifier Amp with respect to the noise generated in the circuit will be obtained by the following equation.

$$Vout2(N) = Vout1(N) \times \left( \frac{R3 + R4}{R4} + \frac{R3}{Z1 + Z2} \right) \quad \text{[EQUATION 6]}$$

As obvious in Equation 6, in the acceleration sensor amplification circuit of the embodiment, the output voltage Vout 2(N) of the operational amplifier Amp with respect to the noise is {(R3+R4)/R4}+{R3/(Z1+Z2)} times the output voltage Vout 1(N) obtained in the circuit shown in FIG. 1.

Accordingly, since the circuit shown in FIG. 4 can obtain the same S/N ratio as that of the circuit shown in FIG. 1, there can be obtained the output in which a common mode noise overlapping with the output of the acceleration sensor (G sensor) is adequately cancelled. Moreover, by adjusting the voltage dividing resistors R3 and R4, sensitivity adjustments can be made without having any influence on the S/N ratio.

The above embodiments have described the acceleration sensor amplification circuits by using acceleration sensors as electric charge type sensors to illustrate the present invention. However, the present invention is not limited to acceleration sensors. For example, the present invention may be used as an amplification circuit for electric charge type sensor incorporating another electric charge type sensor, such as a pyroelectric type infrared ray sensor.

As described above, in the present invention, since the cancellation circuit is connected between the non-inversion input terminal of the operational amplifier and the reference voltage, an output in which a common mode noise overlapping with the output of the electric charge type sensor is adequately cancelled is obtained.

Furthermore, since the voltage dividers having the voltage dividing point for dividing the output voltage of the operational amplifier are arranged and the voltage dividing point is connected to one end of the feedback circuit, sensitivity adjustments (gain adjustments) can be performed without reducing the S/N ratio.

Although the present invention has been described and illustrated in detail above, it is to be understood that modifications will occur to those skilled in the art without departing from the spirit of the invention. The scope of the invention is therefore to be determined solely by the appended claims.

What is claimed is:

1. An amplification circuit for electric charge type sensor comprising:

an operational amplifier including an inversion input terminal and a non-inversion input terminal, the inversion input terminal being connected to one end of an electric charge type sensor and the non-inversion input terminal being connected to the other end of the sensor;

a voltage divider having a voltage dividing point for dividing a voltage output from the operational amplifier;

a negative feedback circuit including a feedback resistor connected between the inversion input terminal and the voltage dividing point and a feedback capacitor connected in parallel to the feedback resistor; and a cancellation circuit including a resistor connected between the non-inversion input terminal and a reference voltage and a capacitor connected in parallel to the resistor.

2. An amplification circuit for electric charge type sensor according to claim 1, wherein the negative feedback circuit has the same circuit constant as the cancellation circuit.

3. An amplification circuit for electric charge type sensor according to one of claims 1 or 2, wherein a line connecting the one end of the electric charge type sensor to the inversion input terminal is arranged in the vicinity of a line connecting the other end of the sensor to the non-inversion input terminal.

* * * * *